United States Patent
Hall et al.

(10) Patent No.: US 7,340,574 B2
(45) Date of Patent: Mar. 4, 2008

(54) METHOD AND APPARATUS FOR SYNCHRONIZING AN INDUSTRIAL CONTROLLER WITH A REDUNDANT CONTROLLER

(75) Inventors: Kenwood H. Hall, Hudson, OH (US); Ronald E. Schultz, Solon, OH (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 322 days.

(21) Appl. No.: 11/215,218

(22) Filed: Aug. 30, 2005

(65) Prior Publication Data

US 2007/0050579 A1    Mar. 1, 2007

(51) Int. Cl.
*G06F 12/00* (2006.01)
(52) U.S. Cl. .................... 711/163; 711/166; 700/253
(58) Field of Classification Search ............... 711/163, 711/166; 700/253
See application file for complete search history.

(56) References Cited

U.S. PATENT DOCUMENTS

| | | | |
|---|---|---|---|
| 5,933,347 A | 8/1999 | Cook et al. | |
| 5,991,774 A * | 11/1999 | Tate et al. | 707/203 |
| 6,112,285 A | 8/2000 | Ganapathy et al. | |
| 6,411,857 B1 | 6/2002 | Flood | |
| 6,675,226 B1 * | 1/2004 | Nair et al. | 709/250 |
| 2002/0065987 A1 | 5/2002 | Garnett et al. | |
| 2005/0081015 A1* | 4/2005 | Barry | 712/1 |

FOREIGN PATENT DOCUMENTS

| | | |
|---|---|---|
| EP | 0460308 | 12/1991 |
| EP | 0817053 | 7/1998 |
| EP | 1249744 | 10/2002 |
| WO | WO-9932947 | 7/1999 |

* cited by examiner

*Primary Examiner*—Reba I. Elmore
(74) *Attorney, Agent, or Firm*—Keith M. Baxter; R. Scott Speroff

(57) ABSTRACT

A method for identifying memory modifications includes designating a first portion of a first memory as read-only. An abort condition is identified responsive to receiving a write instruction having a target address within the first portion. In response to the abort condition, a second portion of the first memory including at least the target address is flagged as being modified. The write instruction is executed.

31 Claims, 3 Drawing Sheets

METHOD AND APPARATUS FOR SYNCHRONIZING AN INDUSTRIAL CONTROLLER WITH A REDUNDANT CONTROLLER

CROSS-REFERENCE TO RELATED APPLICATIONS

Not applicable.

STATEMENT REGARDING FEDERALLY SPONSORED RESEARCH OR DEVELOPMENT

Not applicable

BACKGROUND OF THE INVENTION

The present invention relates to industrial control systems and, in particular, to a method and apparatus for synchronizing an industrial controller with a redundant controller.

This section of this document is intended to introduce various aspects of art that may be related to various aspects of the present invention described and/or claimed below. This section provides background information to facilitate a better understanding of the various aspects of the present invention. It should be understood that the statements in this section of this document are to be read in this light, and not as admissions of prior art.

Industrial controllers are special purpose computers used for controlling factory automation and the like. Under the direction of stored programs, a processor of the industrial controller examines a series of inputs reflecting the status of a controlled process and changes outputs affecting control of the controlled process. The stored control programs may be is continuously executed in a series of execution cycles, executed periodically, or executed based on events.

The inputs received by the industrial controller from the controlled process and the outputs transmitted by the industrial controller to the controlled process are normally passed through one or more input/output (I/O) modules) which serve as an electrical interface between the controller and the controlled process. The inputs and outputs are recorded in an I/O data table in memory. Input values may be asynchronously read from the controlled process by specialized circuitry. Output values are written directly to the I/O data table by the processor, then communicated to the controlled process by the specialized communications circuitry.

Industrial controllers must often provide uninterrupted and reliable operation for long periods of time. One method of ensuring such operation is by using redundant, secondary controller components (including an independent processor) that may be switched in to replace primary controller components while the industrial controller is running. In the event of a failure of a primary component, or the need for maintenance of the components, for example, the secondary components may be activated to take over control functions. Maintenance or testing of the control program may be performed with the primary processor reserving the possibility of switching to the secondary processor (and a previous version or state of the control program) if problems develop.

Ideally, the switch-over between controllers or their components should occur without undue disruption of the controlled process. For this to be possible, the secondary processor must be running or waiting to run the same program (and maintaining its current state) and must be working with the same data in its I/O data table as is the primary processor.

The same control program may be simply pre-stored in each of the primary and secondary processors. The data of the I/O data table, however, cannot be pre-stored but changes continuously during the controlled process. Further, because control processes are I/O intensive, there is typically a large amount of data in the I/O data table. For this reason, transmitting the data to the secondary processor is difficult.

One technique for reducing the overhead associated with the synchronization of the primary and redundant controllers is to monitor specific changes to the I/O table using custom circuitry, such as an application specific integrated circuit (ASIC), that flags changes in the portion of the memory designated for storing the I/O table. Upon reaching a synchronization point, the flags that have been set are read, the associated data in the flagged locations is collected, and the modified data is sent to the redundant controller. This approach is described in greater detail in U.S. Pat. No. 5,933,347, entitled "Industrial Controller with Program Synchronized Updating of Back-up Controller," subject to common assignment with the present application, and incorporated herein by reference in its entirety.

Increasingly, the use of custom processors and associated integrated circuits, such as the monitoring circuit described in the '347 patent, is becoming less feasible. To reduce cost and increase flexibility, industrial control systems are being developed with commercially available microprocessors and supporting circuitry that do not have the same functionality as the previously used customized solutions.

The present invention is directed to overcoming, or at least reducing the effects of, one or more of the problems set forth above.

BRIEF SUMMARY OF THE INVENTION

The present inventors have recognized that memory modifications may be tracked for purposes of synchronizing primary and redundant controllers using commercially available hardware. A memory management unit may be used to set the protection of the monitored memory to read-only. Subsequent writes to the monitored memory are trapped by an abort handler, logged, and subsequently allowed. The logged memory locations may then be communicated between the primary and redundant controllers.

One aspect of the present invention is seen in a method for identifying memory modifications. The method includes designating a first portion of a first memory as read-only. An abort condition is identified responsive to receiving a write instruction having a target address within the first portion. In response to the abort condition, a second portion of the first memory including at least the target address is flagged as being modified. The write instruction is executed.

Another aspect of the present invention is seen in an industrial controller including a memory, a memory management unit, and a processor. The memory is operable to store a user program and a data table. The memory management unit is operable control access to the memory and to store protection data associated with the memory. The memory management unit is operable to signal an abort condition responsive to a memory access instruction conflicting with the protection data. The processor is operable to communicate with the memory through the memory management unit, execute the user program to designate in the protection data a first portion of the memory including the data table as being read-only, issue write instructions in accordance with the user program having target addresses targeting the first portion, and execute an abort handler invoked by the signaling of an abort condition by the memory management resulting from a selected one of the write instructions having a target address conflicting with the read-only designation of the first portion. The abort handler is operable to flag a second portion of the memory including at least the target address as being modified and allow execution of the selected write instruction.

Still another aspect of the present invention is seen in an industrial control system including a primary industrial controller and a secondary industrial controller. The primary industrial controller includes a first memory and is operable to control a process in accordance with a user program and a data table stored in the first memory. The primary industrial controller is operable to designate a first portion of the first memory including the data table as read-only, and identify abort conditions responsive to receiving write instructions from the user program having target addresses within the first portion. In response to the abort conditions, the primary industrial controller is operable to flag subsequent portions of the first memory including at least the target addresses as being modified, execute the write instructions, and periodically generate update data based on the portions of the first memory flagged as being modified. The secondary industrial controller includes a second memory operable to store a copy of the user program and a copy of the data table. The secondary industrial controller is operable to receive the update data and update its copy of the data table based on the update data.

These and other objects, advantages and aspects of the invention will become apparent from the following description. The particular objects and advantages described herein may apply to only some embodiments falling within the claims and thus do not define the scope of the invention. In the description, reference is made to the accompanying drawings which form a part hereof, and in which there is shown a preferred embodiment of the invention. Such embodiment does not necessarily represent the full scope of the invention and reference is made, therefore, to the claims herein for interpreting the scope of the invention.

BRIEF DESCRIPTION OF THE SEVERAL VIEWS OF THE DRAWINGS

The invention will hereafter be described with reference to the accompanying drawings, wherein like reference numerals denote like elements, and.

DETAILED DESCRIPTION OF THE INVENTION

One or more specific embodiments of the present invention will be described below. It is specifically intended that the present invention not be limited to the embodiments and illustrations contained herein, but include modified forms of those embodiments including portions of the embodiments and combinations of elements of different embodiments as come within the scope of the following claims. It should be appreciated that in the development of any such actual implementation, as in any engineering or design project, numerous implementation-specific decisions must be made to achieve the developers' specific goals, such as compliance with system-related and business related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. Nothing in this application is considered critical or essential to the present invention unless explicitly indicated as being "critical" or "essential."

Figure 1:
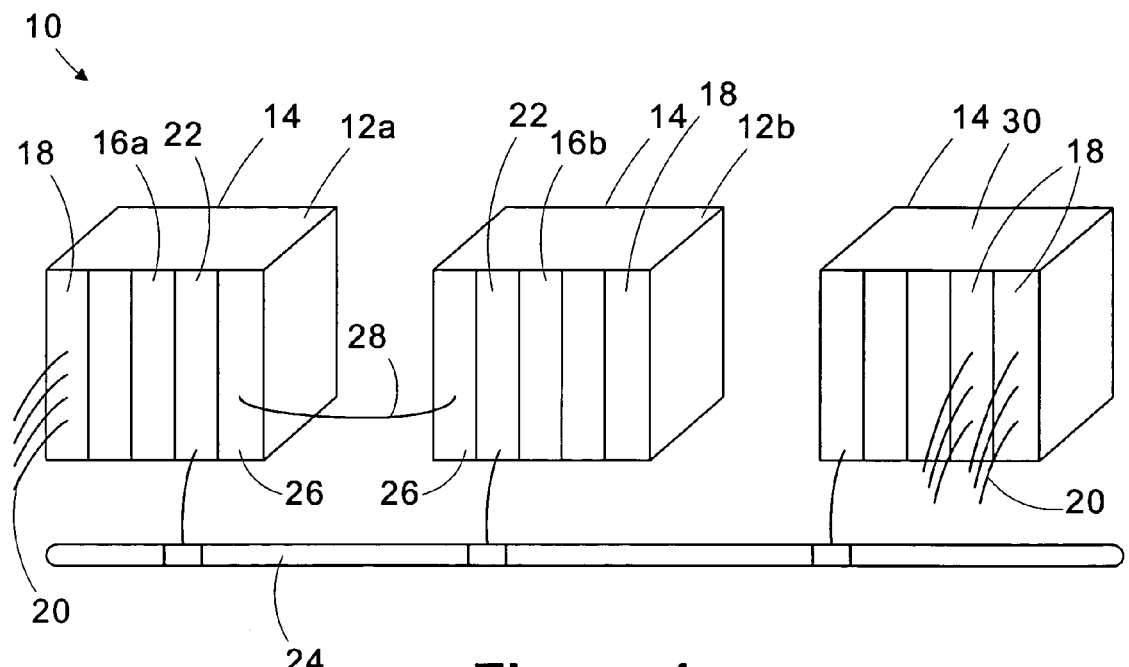
FIG. 1 is a simplified diagram of an industrial control system in accordance with one embodiment of the present invention.

Referring now to the drawings wherein like reference numbers correspond to similar components throughout the several views and, specifically, referring to FIG. 1, the present invention shall be described in the context of an industrial control system 10. The industrial control system 10 includes a primary controller 12a and secondary controller 12b housed in separate racks 14. Each rack 14 holds processor modules 16a and 16b, respectively, to be described in greater detail below.

Within the racks 14 of primary controller 12a are I/O modules 18 having I/O lines 20 communicating with a controlled process (not shown) for transferring input and output signals between the controllers 12a and the controlled process. In addition, both the racks 14 include communication modules 22 connecting the controllers 12a and 12b to a common general purpose link 24 and communication modules 26 connecting controllers 12a and 12(b) to a special dedicated communication link 28. The general purpose communication link 24 may also connect to an I/O rack 30 having additional I/O modules 18 and I/O lines 20. The industrial control system 10 may implement a standard and commonly available high-speed serial network including but not limited to: Ethernet, DeviceNet, ControlNet, Firewire or FieldBus and may optionally include one or more bridges for translating between different of the above standard or other protocols.

The dedicated communication link 28 is used for the communication of I/O data between the processor modules 16a and 16b and the communication of information coordinating a switch-over between the operation of the primary and secondary controllers 12a and 12b.

Figure 2:
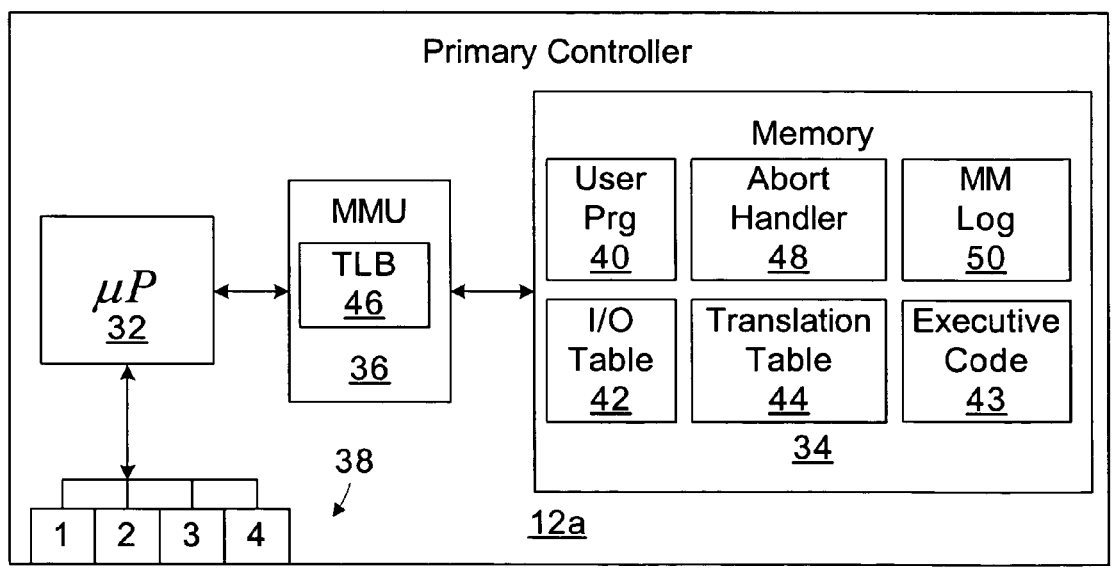
FIG. 2 is a simplified block diagram of an industrial controller in the system of FIG. 1.

Referring now to FIGS. 1 and 2, a simplified block diagram of the primary controller 12a is provided. The primary controller 12a includes a microprocessor 32 communicating with a memory 34 through a memory management unit 36. The primary controller 12a also includes a plurality of ports 38 for communicating with the communication modules 22, 26 and other associated peripherals, such as a human interface module (not shown). In the illustrated embodiment, the microprocessor 32, memory 34, and memory management unit 36 are commercially available hardware components, standard in the computer industry. The memory 34 may include volatile or nonvolatile memory types (i.e., or a combination of both) well known in the art. For example, the memory 34 may include flash memory, dynamic memory, a hard disk, etc.

The memory 34 is operable to store a user program 40 and an I/O data table 42. Generally, the user program 40 may include relay ladder logic frequently used in an industrial control environment, as well as general purpose arithmetic and logical instructions. The user program 40 comprises a sequence of instructions that are executed in repeated execution cycles at a scan point scanning through the user program and writing data to the I/O data table 42. At the same time, the I/O data table 42 is asynchronously updated over the link 24 with current input values from the I/O modules 18. Output values in the I/O data table 42 may be transmitted to the I/O modules 18 synchronously to the execution cycles of the user program 40. The operation of the microprocessor 32, memory 34, and memory management unit 36 is also affected by executive code 43, which includes the operating system and all supervisory mode code that manages the execution of the user program 40.

In general, the primary controller 12a tracks modified memory locations and, when the user program 40 reaches a synchronization point (e.g., at the end of a scan), the modified data is sent to the secondary controller 12b to update its corresponding memory. The primary controller 12a pauses and waits for confirmation of the successful transfer before beginning a subsequent scan. Hence, if control is transferred from the primary controller 12a to the secondary controller 12b, the secondary controller 12b will operate on the same I/O data. The portion of the memory 34 designated for monitoring may vary. In one embodiment, the portion of the memory 34 associated with the I/O data table 42 may be designated for monitoring. In other embodiments, other portions, such as the user program 40, may also be monitored.

Although the invention is described as it may be implemented for identifying changes to the I/O data table 42, it may be applied generally to any application in which a memory or a portion of a memory of any device is to be monitored to identify changes to allow synchronization.

Still referring to FIG. 2, as is known in the art, the memory management unit 36 is typically used to translate virtual memory addresses to actual physical memory addresses in the memory 34. A sequential group of virtual addresses may not be stored in contiguous fashion within the memory 34. The executive code 43 defines and stores a translation table 44 that the memory management unit 36 uses to define the correspondence relationship between virtual addresses and physical memory addresses. When a virtual address is received by the memory management unit 36, it consults the translation table 44 to identify the actual physical memory address that is being referenced. Typically, memory tracked by the memory management unit 36 is grouped into pages of configurable size (e.g., typically between 1 k and 4 k bytes). The most significant bits of a virtual address refer to the page, and the least significant bits refer to an index within the page. To increase performance, the memory management unit 36 includes a translation lookaside buffer (TLB) 46 that stores information regarding recent memory transactions. For example, the TLB 46 may store information from the translation table 44 for the last 32 pages accessed.

Another function of the memory management unit 36 is to allow different protection schemes to be applied to regions of the memory 34. For example, a block may be designated as read/write or read-only, depending on its particular use. The protection information is also stored in the translation table 44 for each page, along with the virtual to physical translation information. The protection information for recently accessed pages is also stored in the TLB 46. If a read command is received that addresses a memory location that is designated as read-only, an abort is issued and the microprocessor 32 executes an abort handler 48 that includes instructions for handling the error condition.

The primary controller 12a uses the protection functions of the memory management unit 36 to track modifications to the memory 34, as described in greater detail below. Generally, the memory locations designated for monitoring (e.g., the I/O data table 42) are designated as read-only in the translation table 44. Any attempted write instructions targeting those locations generate an abort that is addressed by the abort handler 48. The abort handler 48 logs the memory location of the attempted write in a modified memory log 50, changes the protection of the target address to allow the write, and sets the program counter back to the instruction in the user program 40 that generated the write instruction. The re-execution of the write then succeeds, as the memory protection has been changed to read/write.

Figure 3:
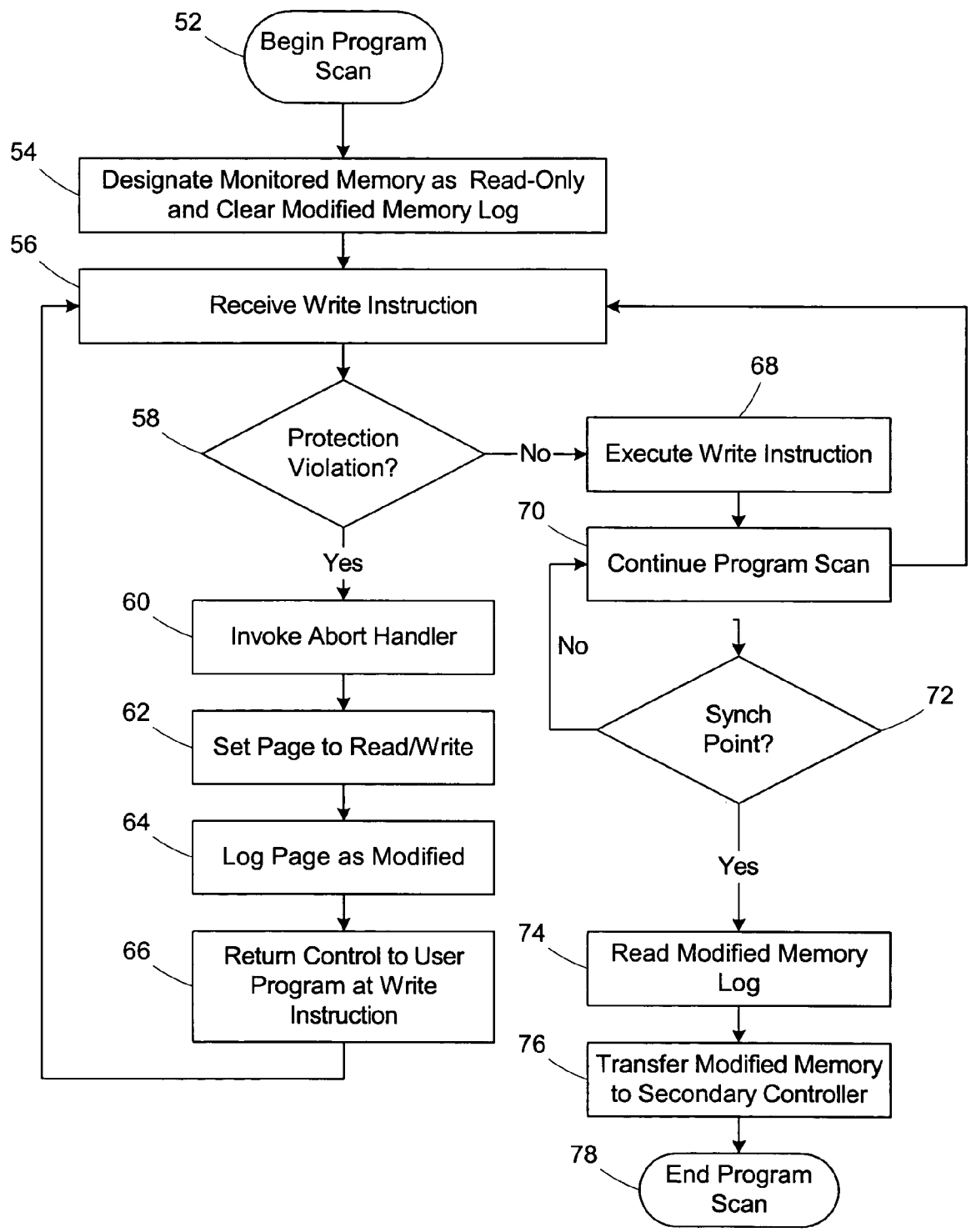
FIGS. 3 and 4 are simplified flow diagrams of methods used by the industrial controller of FIG. 2 to track memory modifications for synchronizing with a redundant controller.

In a first embodiment, described in reference to the simplified flow diagram of FIG. 3, the primary controller 12a tracks memory access by page. In block 52 a program scan is started, and the monitored memory locations are designated as read-only in block 54. The modified memory log 50 is also cleared in block 54 to remove records of the previous scan. Again, the specific portions of the memory 34 designated for monitoring may vary. For purposes of the following examples, the memory locations reserved for the I/O data table 42 are designated for monitoring. The executive code 43 sets the protection status by writing to the translation table 44 and flushing or invalidating the entries in the TLB 46 (i.e., to prevent the TLB 46 from providing state protection data from the previous scan).

In block 56 a write instruction is received. The protection status of the target address of the write instruction is checked in block 58 by the memory management unit 36. If the page including the memory location is read-only, the write instruction is rejected and the abort handler 48 is invoked through an interrupt in block 60. In block 62 the protection state of the page including the target address is set by the abort handler 48 to read/write by modifying the translation table 44 and invalidating or flushing the TLB 46. The page is logged into the modified memory log 50 in block 64. The most significant bits of the target addresses specify the page and the least significant bits indicate an index within the page. For example, using a 32 bit address and a page size of 1 k bytes the 19 most significant bits specify the page, and the 13 least significant bits specify the index. As the primary controller 12a tracks modifications by page in this embodiment, the index bits may be ignored and only the page bits are stored in the modified memory log 50. Alternatively, the pages boundaries may be predetermined, and the modified memory log 50 may include a series of flag bits each associated with one of the pages. In such a case, the abort handler 48 would set the flag associated with the page including the target address as opposed to storing the page bits.

In block 66, the abort handler 48 returns control to the user program 40 by setting the program counter to the instruction that initiated the write request. When the user program 40 re-executes the write instruction, the instruction is received in block 56, the protection check passes in block 58 because the page is now designated as read/write, and the write instruction is executed in block 68. Subsequent write instructions to the same page, (i.e., with different indexes) will also pass the protection check and be written without any subsequent logging or intervention by the abort handler 48.

The program scan continues in block 70. If another write instruction is received, the primary controller 12a transitions back to block 56. If a synchronization point is reached in block 72 (i.e., at the end of the program scan), the modified memory log 50 is read in block 74, and the pages with modified memory values are transferred to the secondary controller 12b in block 76 over the dedicated communication link 28. The program scan ends in block 78. The next program scan begins in block 52 so that the protection status can be changed back to read-only and the TLB 46 can be flushed. The modified memory log 50 is also cleared.

Hence, for every program scan, the pages with modified data values are transferred to the secondary controller 12b. By setting the page size to a relatively small value (e.g., 1 k bytes), and considering that write instruction are often clustered within a given page, the inefficiency resulting from sending an entire page, as opposed to sending individual words, may be kept within tolerable limits.

In some cases, the memory management unit 36 may store a "dirty" bit in the TLB 46 for each page to which a write has been made. This dirty bit may be used to indicate that a page has been modified. The dirty bit functionality may be used in conjunction with the modified memory log 50 to track modified pages. If entries are replaced or flushed from the TLB 46 with the dirty bit set, the modified memory log 50 is updated to reflect the pages with modified data.

Figure 4:
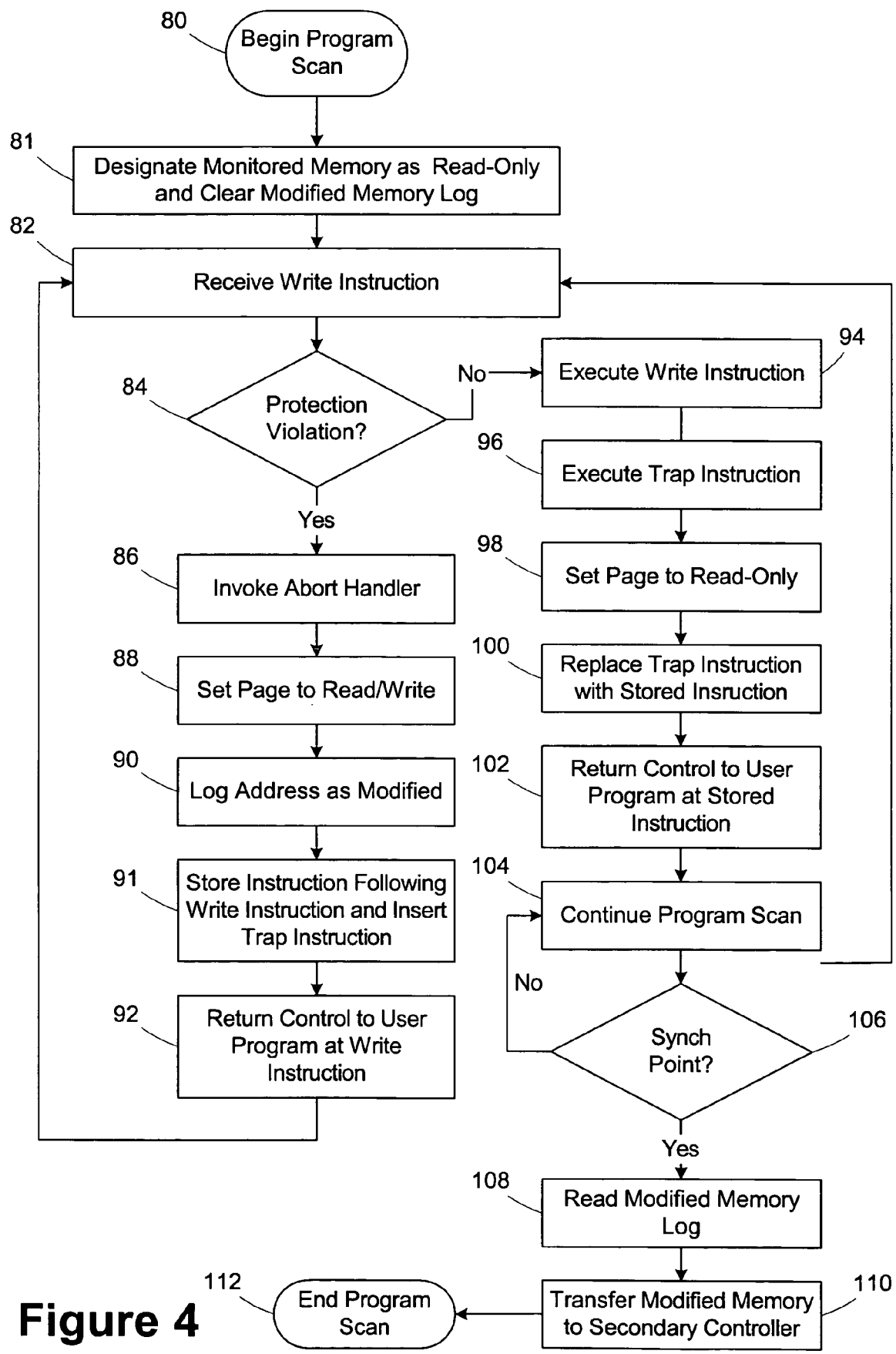

In a second embodiment, illustrated by the simplified flow diagram of FIG. 4, the primary controller 12a tracks the locations of individual write instructions, such that only the modified words within each page are transferred when the synchronization point is reached. This embodiment may be employed where small page sizes are not supported by the memory management unit 36 or where writes tend to be dispersed, rather than clustered. A configuration parameter of the primary controller 12a may be used to select the particular management mode (i.e., page or word).

In block 80 a program scan is started, and the monitored memory locations are designated as read-only in block 81. The modified memory log 50 is also cleared in block 81 to remove records of the previous scan. In block 82 a write instruction is received. The protection status of the target address of the memory management unit is checked in block 84 by the memory management unit 36. If the page including the memory location is read-only, the write instruction is rejected and the abort handler 48 is invoked using by interrupt in block 86. In block 88 the protection state of the page including the target address is set to read/write in the translation table 44 by modifying the translation table 44 and invalidating or flushing the TLB 46. The target address (i.e., including page and index fields) is logged into the modified memory log 50 in block 90.

At this point the abort handler 48 knows the address of the attempted write and the address of the aborted instruction. In block 91, the abort handler 48 stores the instruction following the aborted instruction in a temporary register or memory location and inserts a "trap" instruction, such as a software interrupt (SWI) in its place. Measures should be taken (e.g., by the operating system) to ensure that the store instruction which caused the abort does not modify the program counter such that it still points to the inserted SWI.

In block 92 the abort handler 48 returns control to the user program 40 by setting the program counter to the write instruction. When the user program 40 re-executes the write instruction, the instruction is received in block 82, the protection check passes in block 84 because the page is not designated as read/write, and the write instruction is executed in block 94.

The trap instruction is executed in block 96. The abort handler 48 is invoked by the trap instruction and proceeds to change the protection status back to read-only in block 98, replace the trap instruction with the displaced instruction in block 100, and return control to the user program 40 with the program counter pointing to the instruction following the write in block 102.

The program scan continues in block 104. If another write instruction is received, the primary controller 12a transitions back to block 82. If a synchronization point is reached in block 106 (i.e., at the end of the program scan), the modified memory log 50 is read in block 108, and the specific modified memory values are transferred to the secondary controller 12b in block 110 over the dedicated communication link 28. The program scan ends in block 112.

The embodiment of FIG. 4 may be further modified by counting the number of times each page is accessed and storing the count in the modified memory log 50. After a predetermined threshold is reached, such as 5 writes to a page, the entire page is logged into the modified memory log 50, the individual entries are removed, and the page is set to read/write for the remainder of the scan, as described in the embodiment of FIG. 3. This modification allows write instructions that are clustered on a give page to proceed without further intervention by the abort handler 48, thereby increasing efficiency.

In another embodiment, instead of using a trap instruction, the abort handler 48 may analyze the aborted write instruction and execute the write instruction itself targeting the address while operating in a supervisory mode that overrides the read-only protection. The abort handler 48 would then return control to the user program 40 with the program counter pointing at the next instruction.

Tracking memory changes using the protection functions of the memory management unit, as described herein, has numerous advantages. For example, the use of conventional hardware reduces the cost, increases the flexibility, and reduces the development time for the industrial control system 10.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

We claim:

1. An industrial controller, comprising:
a memory operable to store a user program and a data table;
a memory management unit operable control access to the memory and to store protection data associated with the memory, the memory management unit being operable to signal an abort condition responsive to a memory access instruction conflicting with the protection data;
a processor operable to:
communicate with the memory through the memory management unit;
execute the user program to designate in the protection data a first portion of the memory including the data table as being read-only
issue write instructions in accordance with the user program having target addresses targeting the first portion;
execute an abort handler invoked by the signaling of an abort condition by the memory management resulting from a selected one of the write instructions having a target address conflicting with the read-only designation of the first portion, the abort handler being operable to flag a second portion of the memory including at least the target address as being modified and allow execution of the selected write instruction.

2. The industrial controller of claim 1, wherein the abort handler is operable to designate the second portion as read/write prior to allowing execution of the selected write instruction.

3. The industrial controller of claim 2, wherein the abort handler is operable to return control to the user program at the selected write instruction following the designation of the second portion as read/write.

4. The industrial controller of claim 1, wherein the abort handler is operable to execute the selected write instruction in a processor mode that overrides the read-only designation of the first portion.

5. The industrial controller of claim 2, wherein the memory management unit is operable to organize the memory in pages, and the second portion comprises a selected page including the target address.

6. The industrial controller of claim 5, wherein the memory management unit is operable to allow execution of subsequent write requests having target addresses targeting the selected page without identifying an abort condition.

7. The industrial controller of claim 5, wherein the abort handler is operable to flag the second portion by logging the selected page.

8. The industrial controller of claim 1, wherein the abort handler is operable to flag the second portion further by logging the target address.

9. The industrial controller of claim 1, further comprising periodically transferring portions of the first memory flagged as being modified to a redundant controller.

10. The industrial controller of claim 9, wherein the processor, in accordance with the user program, is operable to designate the first portion as being read-only following the transferring of the portions of the first memory flagged as being modified.

11. The industrial controller of claim 1, further comprising allowing subsequent write instructions having target addresses within portions of the first memory flagged as being modified without identifying abort conditions.

12. The industrial controller of claim 2, further comprising designating the second portion as read-only after executing the write instruction.

13. The industrial controller of claim 12, wherein the first memory is organized in pages, each of the target addresses is associated with one of the pages, and abort handler is further operable to:
log the target addresses;
determine a count of write requests associated with a selected page; and
designate the selected page as read/write for subsequent write requests responsive to the count exceeding a predetermined threshold; and
flag the selected page as being modified.

14. The industrial controller of claim 2, wherein the abort handler is operable to:
store an instruction in the user program following the selected write instruction;
modify the user program to replace the stored instruction with a trap instruction, operable to return control to the abort handler upon execution,
return control to the user program at the selected write instruction, the processor being operable to execute the selected write instruction and the trap instruction to return control to the abort handler;
replace the trap instruction with the stored instruction;
designate the second portion as read-only; and
return control of to the user program at the replaced instruction following the selected write instruction.

15. A method for identifying memory modifications, comprising:
designating a first portion of a first memory as read-only;
identifying an abort condition responsive to receiving a write instruction having a target address within the first portion; and
in response to the abort condition, flagging a second portion of the first memory including at least the target address as being modified, and executing the write instruction.

16. The method of claim 15, further comprising designating the second portion as read/write prior to executing the write instruction.

17. The method of claim 16, wherein the write instruction originates from a user program, and executing the write instruction further comprises returning control to the user program at the write instruction following the designation of the second portion as read/write.

18. The method of claim 17, further comprising storing the user program in a third portion of the memory separate from the first portion.

19. The method of claim 15, wherein executing the write instruction further comprises executing the write instruction in a mode that overrides the read-only designation of the first portion.

20. The method of claim 16, wherein the first memory is organized in pages, and the second portion comprises a selected page including the target address.

21. The method of claim 20, further comprising allowing execution of subsequent write requests having target addresses targeting the selected page without identifying an abort condition.

22. The method of claim 20, wherein flagging the second portion further comprises logging the selected page.

23. The method of claim 15, wherein flagging the second portion further comprises logging the target address.

24. The method of claim 15, further comprising:
receiving a plurality of write requests having target addresses within the first portion;
repeating the step of identifying the abort condition and steps performed in response to identifying the abort condition for at least a subset of the target addresses;
periodically transferring portions of the first memory flagged as being modified to a second memory.

25. The method of claim 24, further comprising designating the first portion as being read-only following the transferring of the portions of the first memory flagged as being modified.

26. The method of claim 25, further comprising allowing subsequent write instructions having target addresses within portions of the first memory flagged as being modified without identifying abort conditions.

27. The method of claim 16, further comprising designating the second portion as read-only after executing the write instruction.

28. The method of claim 27, wherein the first memory is organized in pages, and the method further comprises:
receiving a plurality of write requests having target addresses within the first portion, each target address being associated with one of the pages;
repeating the step of identifying the abort condition and steps performed in response to identifying the abort condition for at least a subset of the target addresses, wherein flagging the second portion comprises logging the target addresses;
determining a count of write requests associated with a selected page; and designating the selected page as read/write for subsequent write requests responsive to the count exceeding a predetermined threshold; and flagging the selected page as being modified.

29. The method of claim 16, wherein the write instruction originates from a user program, and the method further comprises:

storing an instruction in the user program following the write instruction;

modifying the user program to replace the stored instruction with a trap instruction;

executing the user program at the write instruction;

executing the trap instruction; and responsive to executing the trap instruction, replacing the trap instruction with the stored instruction, designating the second portion as read-only, and resuming execution of the user program at the replaced instruction following the write instruction.

30. An industrial control system, comprising:

a primary industrial controller including a first memory and being operable to control a process in accordance with a user program and a data table stored in the first memory, designate a first portion of the first memory including the data table as read-only, identify abort conditions responsive to receiving write instructions from the user program having target addresses within the first portion, and in response to the abort conditions, flag subsequent portions of the first memory including at least the target addresses as being modified, execute the write instructions; and periodically generate update data based on the subsequent portions of the first memory flagged as being modified; and a secondary industrial controller including a second memory operable to store a copy of the user program and a copy of the data table, the secondary industrial controller being operable to receive the update data and update its copy of the data table based on the update data.

31. The industrial control system of claim 30, wherein the secondary controller is operable to take over control of the process responsive to a swithover from the primary industrial controller.

* * * * *